(12) United States Patent
     Voronin

(10) Patent No.: US 11,651,970 B2
(45) Date of Patent: May 16, 2023

(54) SYSTEMS AND METHODS FOR SELECTIVE ION MASS SEGREGATION IN PULSED PLASMA ATOMIC LAYER ETCHING

(71) Applicant: Tokyo Electron Limited, Tokyo (JP)

(72) Inventor: Sergey Voronin, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 152 days.

(21) Appl. No.: 17/314,325

(22) Filed: May 7, 2021

(65) Prior Publication Data

US 2021/0366723 A1    Nov. 25, 2021

Related U.S. Application Data

(60) Provisional application No. 63/027,105, filed on May 19, 2020.

(51) Int. Cl.
    *H01L 21/311*   (2006.01)
    *H01L 21/67*    (2006.01)
    *H01J 37/32*    (2006.01)

(52) U.S. Cl.
    CPC .. *H01L 21/31116* (2013.01); *H01J 37/32137* (2013.01); *H01J 37/32422* (2013.01);
    (Continued)

(58) Field of Classification Search
    CPC ........... H01L 21/31116; H01J 37/32137; H01J 37/32422; H01J 37/32449; H01J 2237/3341
    See application file for complete search history.

(56) References Cited

U.S. PATENT DOCUMENTS 7,166,233 B2  1/2007  Johnson et al.
8,883,028 B2  11/2014 Kanarik
         (Continued)

FOREIGN PATENT DOCUMENTS

EP          3503167 A1     6/2019
KR   10-2019-0114274 A    10/2019

OTHER PUBLICATIONS

Lieberman, M. A. "Model of Plasma Immersion Ion Implantation." Journal of Applied Physics, vol. 66, No. 7, 1989, pp. 2926-2929., doi:10.1063/1.344172.

(Continued)

*Primary Examiner* — Binh X Tran

(57) ABSTRACT

Differences in ion mass of lighter ions (having a higher mobility) and heavier ions are utilized in conjunction with bias voltage modulation of an atomic layer etch (ALE) to provide a fast ALE process. The difference in ion mobility achieves surface modification with reactive neutral species in the absence of a bias voltage, and ion bombardment with lighter ions (e.g., inert or less reactive ions) in the presence of a bias voltage. By modulating the bias voltage, preferential ion bombardment is achieved with lighter ions without the need to physically separate or purge the reactive precursors and inert gases supplied to the process chamber for a given ALE cycle. A "fast" plasma ALE process is provided which improves etch rate, throughput and cost-efficiency by enabling the same gas chemistry composition (e.g., reactive precursor and inert gas combination) to be kept in the process chamber during a given ALE cycle.

20 Claims, 7 Drawing Sheets

(52) U.S. Cl.
CPC .. *H01J 37/32449* (2013.01); *H01L 21/67069* (2013.01); *H01J 2237/3341* (2013.01)

(56) References Cited

U.S. PATENT DOCUMENTS

| | | | |
|---|---|---|---|
| 9,627,221 B1 | 4/2017 | Zaitsu et al. | |
| 10,515,782 B2 | 12/2019 | Donnelly et al. | |
| 2012/0181252 A1* | 7/2012 | Makino | H01J 37/32449 156/345.26 |
| 2016/0099133 A1 | 4/2016 | Kanarik | |
| 2019/0244805 A1 | 8/2019 | Tan et al. | |
| 2019/0318916 A1 | 10/2019 | Yoshida et al. | |
| 2020/0266070 A1* | 8/2020 | Voronin | H01L 21/30655 |
| 2020/0273711 A1* | 8/2020 | Yoshida | H01L 21/31111 |
| 2020/0381261 A1* | 12/2020 | Ventzek | H01L 21/30621 |
| 2021/0364909 A1* | 11/2021 | Nozawa | C23C 14/08 |
| 2022/0005740 A1* | 1/2022 | Paeng | H01L 21/268 |
| 2022/0199422 A1* | 6/2022 | Yang | H01L 21/32136 |
| 2022/0216050 A1* | 7/2022 | Yu | H01L 21/02274 |

OTHER PUBLICATIONS

Korean Intellectual Property Office, The International Search Report and Written Opinion for International Application No. PCT/US2021/031274, dated Aug. 27, 2021, 9 pages.

\* cited by examiner

300

Supply a first process gas and a second process gas to a process chamber in which a substrate is disposed, wherein the first process gas is utilized for the layer modification step and the second process gas is utilized for the etch step
310

Perform the layer modification step by applying a source voltage to a first electrode disposed within the process chamber to generate an electric field that dissociates and converts the first process gas and the second process gas into a plasma, wherein a plasma sheath located within a boundary region of the plasma comprises a mixture of reactive neutral species, first ions from the first process gas having a heavier ion mass and second ions from the second process gas having a lighter ion mass
320

Perform the etch step by modulating a bias voltage applied to a second electrode disposed within the process chamber so that only the second ions having the lighter ion mass reach and bombard the substrate during the etch step of the at least one plasma ALE cycle
330

```
┌─────────────────────────────────────────────────────────────┐
│ Supply a first process gas and a second process gas to a    │
│ process chamber in which a substrate is disposed            │
│                                                         410 │
└─────────────────────────────────────────────────────────────┘
                              │
                              ▼
┌─────────────────────────────────────────────────────────────┐
│ Form a plasma in the process chamber utilizing a source     │
│ voltage of the plasma processing system                     │
│                                                         420 │
└─────────────────────────────────────────────────────────────┘
                              │
                              ▼
┌─────────────────────────────────────────────────────────────┐
│ During a layer modification step of an atomic layer etch    │
│ (ALE), modify a surface of the substrate to form a modified │
│ surface layer by exposing the surface of the substrate to a │
│ first ion species of the plasma, the first ion species      │
│ being reactive with the surface of the substrate            │
│                                                         430 │
└─────────────────────────────────────────────────────────────┘
                              │
                              ▼
┌─────────────────────────────────────────────────────────────┐
│ During an etch step of the ALE, remove the modified surface │
│ of the substrate by bombarding the modified surface with a  │
│ second ion species of the plasma, the first ion species     │
│ having a first ion mass and the second ion species having a │
│ second ion mass, which is less than the first ion mass      │
│                                                         440 │
└─────────────────────────────────────────────────────────────┘
                              │
                              ▼
┌─────────────────────────────────────────────────────────────┐
│ Modulate a bias voltage of the plasma processing system so  │
│ that while removing the modified surface of the substrate,  │
│ the second ion species bombards the modified surface more   │
│ than the first ion species bombards the modified surface    │
│                                                         450 │
└─────────────────────────────────────────────────────────────┘
                              │
                              ▼
┌─────────────────────────────────────────────────────────────┐
│ Cyclically repeat the layer modification step and the etch  │
│ step                                                    460 │
└─────────────────────────────────────────────────────────────┘
```

Fig. 6

SYSTEMS AND METHODS FOR SELECTIVE ION MASS SEGREGATION IN PULSED PLASMA ATOMIC LAYER ETCHING

PRIORITY CLAIM

This application claims priority to U.S. Provisional Patent Application No. 63/027,105, entitled "SYSTEMS AND METHODS FOR SELECTIVE ION MASS SEGREGATION IN PULSED PLASMA ATOMIC LAYER ETCHING," filed May 19, 2020 the disclosure of which is expressly incorporated herein, in its entirety, by reference.

BACKGROUND

The present disclosure relates to the processing of substrates in plasma process equipment. In particular, it provides embodiments of a system and a method for atomic layer etching.

Moore's law extension in the semiconductor industry requires processing of features at nanometer scale. However, scaling beyond 5 nm, for example, requires extremely tight tolerance (e.g., angstrom scale tolerance) and high selectivity to materials and minimum reactive ion etching (RIE) lag. While atomic layer processes can meet these requirements, the low throughput associated with these processes make them unsuited to high-volume manufacturing.

Atomic layer processes have become important in the industry, offering techniques capable of accurately controlling material properties and nanometer dimensions. These processes include atomic layer deposition (ALD) and atomic layer etching (ALE). ALE is generally known to involve processes which remove thin layers sequentially (often a monolayer at a time) through one or more self-limiting reactions. Thus, ALE processes offer improved etch performance by decoupling the etch process into sequential steps of surface modification and removal of the modified surface, thereby segregating the roles of radical flux and ion flux and energy. ALE processes often include multiple ALE cycles of layer modification and etch steps, wherein the layer modification step modifies the exposed surfaces and the etch step selectively removes the modified layer. Thus, in one embodiment a series of self-limiting reactions may occur and the cycle may be repeatedly performed. In other embodiments, the process may use just one cycle. As used herein, an ALE process may also include quasi-ALE processes. In such processes, a series of modification and etch step cycles may still be used. However, the removal step may not be purely self-limiting as after removal of the modified layer, the etch substantially slows down, though it may not completely stop.

In general, both modification ("A") and removal ("B") steps require different precursors ("A" and "B" respectively). It is difficult to achieve process self-limitation and good synergy by using the same chemistries in the whole process sequence. This is related to unwanted bombardment of the target by ions "A" during step "B" and vice versa. There can also be unwanted exposition to neutral species "A" during step "B" as well. Hence, physical separation of precursors is needed which can be achieved by cyclic feeding and purging "A" and "B" in the chamber between different steps. This well-known solution can significantly increase the cycle time and requires more expensive and complicated hardware approaches (fast switching mass flow controllers, small chamber volumes, etc.).

FIG. 1 (Prior Art) depicts a conventional plasma ALE process in which a target 100 (e.g., a substrate) having a surface material 105 is disposed within a process chamber (not shown) and exposed to a reactive precursor 110, which adsorbs on and reacts with the exposed surfaces of the surface material 105 to produce a modified surface layer 120. This layer modification step may be self-limiting, for example, if the reaction stops after adsorbing one monolayer. After the process chamber is purged, exposed surfaces of the target are bombarded with low energy non-reactive ions 130 (e.g., an inert gas) to remove the modified surface layer 120 via sputtering (or etching). The ion bombardment (or etch step) may be self-limiting if the energy of the ions is sufficient to remove the modified surface layer 120, but insufficient to sputter (etch) the underlying surface material 105. Once the modified surface layer is removed, the process chamber is again purged to remove etching products before the next ALE cycle begins.

It will be recognized by those skilled in the art that the ALE process of FIG. 1 is merely exemplary and other processes also exist. In other ALE processes, for example, the modification step may be achieved by directional ion bombardment (e.g., hydrogen (H), helium (He) ion, etc. bombardment), and the removal step may be achieved by removing the modified layer by use of a chemical reaction. One example of such an approach is silicon nitride layer modification by H+ bombardment with its further removal in a fluorine-containing plasma. Such approaches similarly have difficulties as described above with the physical separation of precursors being needed which can be achieved by cyclic feeding and purging "A" and "B" in the chamber between different steps.

Mixing reactive precursors and inert gases in the process chamber leads to reactive ion formation, which can gain the same energy as non-reactive ions and damage the lattice structure of the target substrate. As such, the plasma ALE process shown in FIG. 1 requires physical separation between fluxes of the reactive precursor 110 and non-reactive ions 130. Similarly, if both steps (modification and removal) require reactive precursors, separation between the steps may be needed. This separation is achieved in the process flow shown in FIG. 1 by a cyclic pulsing of process gases (e.g., reactive precursors and inert gases or two different precursors), each of which is followed by a purging step. Unfortunately, the need to purge the process chamber increases the etch cycle time and limits throughput, which is impractical for high-volume manufacturing.

SUMMARY

Systems and methods are provided herein for atomic layer etching (ALE). The difference in ion mass of lighter, inert ions (which have a higher mobility) and heavier, reactive ions is advantageously utilized in conjunction with bias voltage modulation of the ALE process to provide a fast ALE process. The difference in ion mobility is utilized to achieve surface modification with reactive neutral species in the absence of a bias voltage, and ion bombardment with lighter, inert ions or lighter less reactive ions in the presence of a bias voltage. By modulating the bias voltage, preferential lighter ion bombardment is achieved with lighter inert ions (or lighter less reactive ions) without the need to physically separate or purge the reactive precursors and inert gases supplied to the process chamber for a given ALE cycle. Thus, a "fast" plasma ALE process is provided which improves etch rate, throughput and cost-efficiency by enabling the same gas chemistry composition (e.g., reactive precursor and inert gas combination) to be kept in the process chamber during a given ALE cycle.

As described herein, a method for preferable surface bombardment by the ions of a targeted mass without physical separation of precursors "A" (modification precursor) and "B" (removal precursor) in the process chamber. The techniques described may also be extended to complex process plasmas with a number of precursors large than two, i.e. "A", "B" "C," etc.

In a first method embodiment, a method for performing at least one plasma atomic layer etch (ALE) cycle comprising a layer modification step and an etch step is provided. The method comprises supplying a first process gas and a second process gas to a process chamber in which a substrate is disposed, wherein the first process gas is utilized for the layer modification step and the second process gas is utilized for the etch step. The method further comprises performing the layer modification step by applying a source voltage to a first electrode disposed within the process chamber to generate an electric field that dissociates and converts the first process gas and the second process gas into a plasma, wherein a plasma sheath located within a boundary region of the plasma comprises a mixture of reactive neutral species, first ions from the first process gas with having a heavier ion mass and second ions from the second process gas with having a lighter ion mass. The method also comprises performing the etch step by modulating a bias voltage applied to a second electrode disposed within the process chamber so that only the second ions with having the lighter ion mass reach and bombard the substrate during the etch step of the at least one plasma ALE cycle.

In an alternative of the first method embodiment, the first process gas comprises a reactive precursor and the second process gas comprises an inert gas, the first ions being reactive ions and the second ions being non-reactive ions. In another alternative, the first process gas comprises a first reactive precursor and the second process gas comprises a second reactive precursor, the first ions being first reactive ions and the second ions being second reactive ions. In yet another alternative the modulating the bias voltage comprises turning the bias voltage off during a first time period, while the source voltage is applied, so that the substrate receives continuous flux of the reactive neutral species during the layer modification step of the at least one plasma ALE cycle. In still another alternative, the modulating the bias voltage further comprises turning the bias voltage on for a second time period following the first time period, so that only the second ions reach and bombard the substrate during the etch step of the at least one plasma ALE cycle. In another alternative, the second time period is less than a transit time of the first ions through the plasma sheath, and wherein the first time period is greater than the transit time of the first ions through the plasma sheath. In still another alternative, the second time period is less than a transit time of the first ions through the plasma sheath and greater than a transit time of second ions through the plasma sheath. In another alternative turning the bias voltage on for the second time period comprises applying a direct current (DC) bias voltage to the second electrode during the second time period. In another alternative, turning the bias voltage on for the second time period further comprises gradually adjusting the DC bias voltage during a portion of the second time period. In yet another alternative, modulating the bias voltage further comprises reversing a polarity of the bias voltage during a third time period, the third time period following the second time period, to minimize the first ions that reach and bombard of the substrate. In still another alternative a purge is not performed between the layer modification step and the etch step.

In a second method embodiment, a method for performing an atomic layer etch (ALE) in a plasma processing system, the ALE comprising a layer modification step and an etch step is provided. The method comprises supplying a first process gas and a second process gas to a process chamber in which a substrate is disposed and forming a plasma in the process chamber utilizing a source voltage of the plasma processing system. According to the method, during the layer modification step, modifying a surface of the substrate to form a modified surface layer by exposing the surface of the substrate to a first ion species of the plasma, the first ion species being reactive with the surface of the substrate. During the etch step, the method further includes removing the modified surface of the substrate by bombarding the modified surface with a second ion species of the plasma, the first ion species having a first ion mass and the second ion species having a second ion mass, which is less than the first ion mass. The method also comprises modulating a bias voltage of the plasma processing system so that while removing the modified surface of the substrate, the second ion species bombards the modified surface more than the first ion species bombards the modified surface. Further, the method comprises cyclically repeating the layer modification step and the etch step.

In an alternative of the second method embodiment, the modulating the bias voltage comprises turning the bias voltage on during the etch step and (1) turning the bias voltage off during the layer modification step and/or (2) adjusting the bias voltage to have a smaller amplitude during the layer modification step. In another alternative, of the second method embodiment, only the second ion species reach and bombard the substrate during the etch step. In still another embodiment, a time period in which the bias voltage is turned on is less than a first transit time of the first ion species through a plasma sheath. In another alternative, the time period in which the bias voltage is turned on is greater than a second transit time of the second ion species through the plasma sheath. In still another alternative, turning the bias voltage on comprises applying a constant direct current (DC) bias voltage. In still another alternative, turning the bias voltage on comprises gradually adjusting the DC bias voltage for at least a portion of time. In another alternative of the second method embodiment, a purge is not performed between the layer modification step and the etch step.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIG. 5 is a flowchart diagram illustrating one embodiment of a method to perform at least one plasma atomic layer etch (ALE) cycle in accordance with the techniques described herein.

FIG. 6 is a flowchart diagram illustrating one embodiment of a method to perform an atomic layer etch (ALE) in a plasma processing system.

DETAILED DESCRIPTION

Systems and methods are provided herein for atomic layer etching (ALE). The difference in ion mass of lighter ions (which have a higher mobility) and heavier, ions is advantageously utilized in conjunction with bias voltage modulation of the ALE process to provide a fast ALE process. In one embodiment, the lighter ions may be inert ions and the heavier ions may be reactive ions. The difference in ion mobility is utilized to achieve surface modification with reactive neutral species in the absence of a bias voltage, and ion bombardment with lighter, inert ions in the presence of a bias voltage. By modulating the bias voltage, preferential lighter ion bombardment is achieved with lighter inert ions without the need to physically separate or purge the reactive precursors and inert gases supplied to the process chamber for a given ALE cycle. In a second embodiment, two reactive ions species are utilized, one being lighter than the other. The differences in the ion weights may preferentially be utilized to provide one or the other ion to the surface of the substrate during the modification or etch steps of the ALE process.

Thus, bias voltage modulation may be utilized to accomplish a variety of effects during the ALE process depending upon the particular ions generated so that separate steps of the process may accomplished without the need to physically separate or purge the various gases from the process chamber for a particular step of the ALE cycle. For example, a variety of options may exist, including but not limited to: (1) use lighter ions A+ to modify the surface, while etching is performed by reactive radicals B, (2) use reactive species B to modify the surface while reactive (or non-reactive) lighter ions A+ are used to remove the modified layer, and (3) use reactive ions B+ for surface modification in one step (for example by applying a small continuous wave power to the bias electrode so that the surface is bombarded by A+ and B+), while lighter reactive (or not reactive) ions A+ are used to remove the modified layer at a high energy in a separate step. It will be recognized that the bias voltage modulation techniques which advantageously utilize differences in ion weights may further be implemented in other manners as the bias voltage modulation techniques are not limited to only those exemplary embodiments described.

Thus, a "fast" plasma ALE process is provided which improves etch rate, throughput and cost-efficiency by enabling the same gas chemistry composition (in one example a reactive precursor and inert gas combination or in another example two reactive precursors) to be kept in the process chamber during a given ALE cycle.

Figure 2:
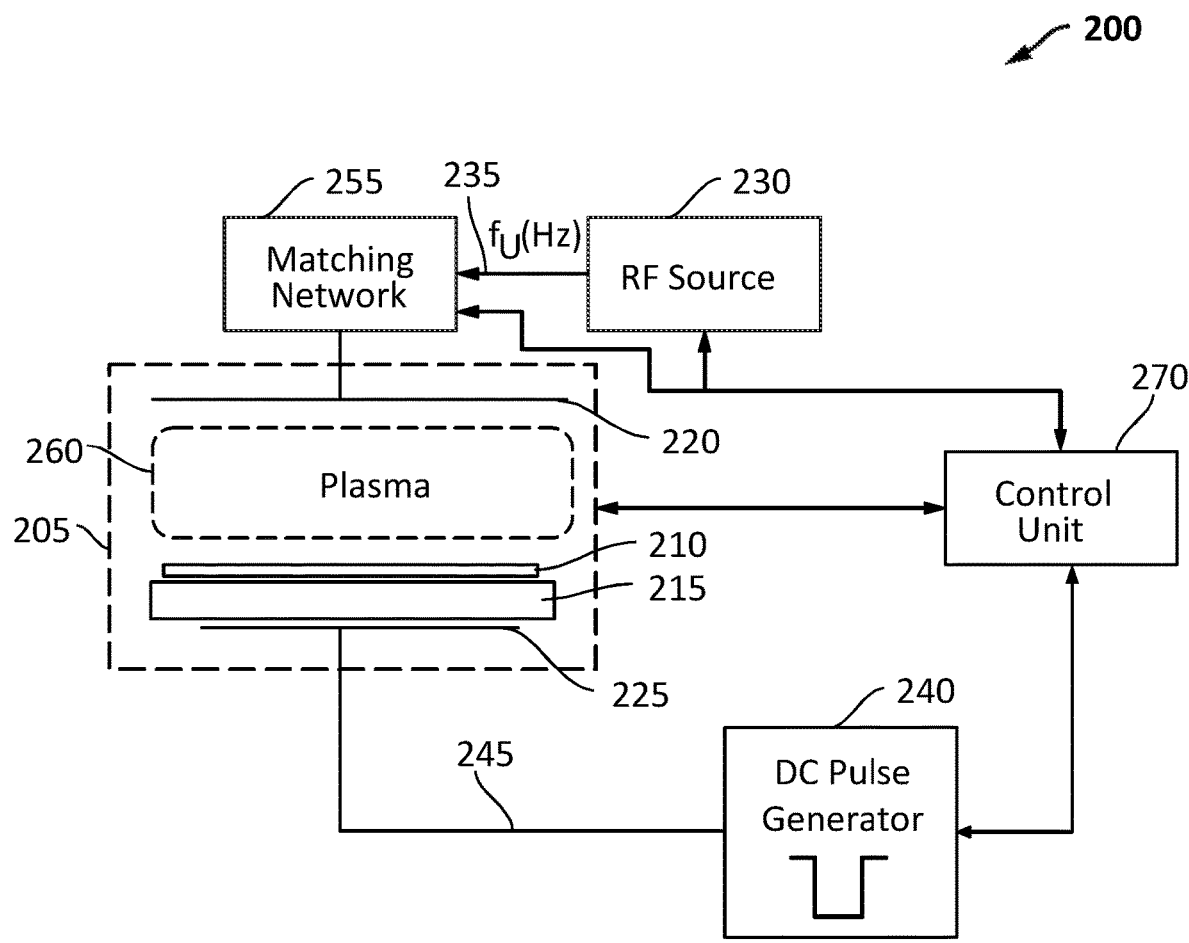
FIG. 2 is a block diagram illustrating one embodiment of a plasma processing system that may be used to perform a plasma ALE process in accordance with techniques described herein.

FIG. 2 provides one example embodiment for a plasma processing system 200 that can be used with respect to the disclosed techniques and is provided only for illustrative purposes. The plasma processing system 200 may be a capacitively coupled plasma processing apparatus, inductively coupled plasma processing apparatus, microwave plasma processing apparatus, Radial Line Slot Antenna (RLSA™) microwave plasma processing apparatus, electron cyclotron resonance (ECR) plasma processing apparatus, or other type of processing system or combination of systems. Thus, it will be recognized by those skilled in the art that the techniques described herein may be utilized with any of a wide variety of plasma processing systems.

The plasma processing system 200 can be used for a wide variety of operations including, but not limited to, etching, deposition, cleaning, plasma polymerization, plasma-enhanced chemical vapor deposition (PECVD), atomic layer deposition (ALD), atomic layer etch (ALE), and so forth. The structure of a plasma processing system 200 is well known, and the particular structure provided herein is merely of illustrative purposes. It will be recognized that different and/or additional plasma process systems may be implemented while still taking advantage of the techniques described herein.

Looking in more detail to FIG. 2, the plasma processing system 200 may include a process chamber 205. As is known in the art, process chamber 205 may be a pressure controlled chamber. A substrate 210 (in one example a semiconductor wafer) may be held on a stage or chuck 215. An upper electrode 220 and a lower electrode 225 may be provided as shown. The upper electrode 220 may be electrically coupled to a radio frequency (RF) source 230 through a matching network 255. In some embodiments, the RF source 230 may provide a source voltage 235 at an upper frequency ($f_U$) to the matching network 255. The lower electrode 225 may be electrically coupled to a DC pulse generator source 240. In some embodiments, the DC pulse generator source 240 may provide a bias voltage 245 to the lower electrode 225. Although not shown in FIG. 2, it will be known by those skilled in the art that a voltage may also be applied to the chuck 215. Optionally, the DC pulse generator source 240 could be a higher frequency source, such as an RF source, which may be controlled to provide the bias modulation described below.

Components of the plasma processing system 200 can be connected to, and controlled by, a control unit 270 that in turn can be connected to a corresponding memory storage unit and user interface (all not shown). Various plasma processing operations can be executed via the user interface, and various plasma processing recipes and operations can be stored in the memory storage unit. Accordingly, a given substrate can be processed within the process chamber 205 with various microfabrication techniques. It will be recognized that control unit 270 may be coupled to various components of the plasma processing system 200 to receive inputs from, and provide outputs to, the components. In some embodiments, the control unit 270 may be coupled to the DC pulse generator source 240 to control the bias voltage 245 supplied, for example, to the lower electrode 225.

The control unit 270 can be implemented in a wide variety of manners. In one example, the control unit 270 may be a computer. In another example, the control unit 270 may include one or more programmable integrated circuits that are programmed to provide the functionality described herein. For example, one or more processors (e.g., a microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality of a particular plasma process recipe. It is further noted that the software or other programming instructions executed by the programmable integrated circuits can be stored in one or more non-transitory computer-readable mediums (e.g., memory storage devices, FLASH memory, dynamic random access (DRAM) memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

In operation, the plasma processing system 200 shown in FIG. 2 generates a plasma 260 in the process chamber 205 by applying power from the RF source 230 and the DC pulse generator source 240 to the upper and lower electrodes and the process chamber body. The application of power generates a high-frequency electric field between the upper electrode 220 and the lower electrode 225, which dissociates and converts process gas(es) delivered to the process chamber 205 into a plasma 260. The generated plasma can be used for processing a target substrate (such as substrate 210 or any material to be processed) in various types of treatments such as, but not limited to, plasma etching, deposition and/or sputtering.

The example plasma processing system 200 shown in FIG. 2 utilizes two sources, an RF source and a pulsed DC bias generator. In some embodiments, the RF source 230 may provide source power at relatively high frequencies ($f_U$) to convert the process gas(es) delivered to the process chamber 205 into plasma and to control the plasma density, while the DC pulse generator source 240 provides bias power to control ion bombardment energy. As known in the art, the source power and the bias power may be applied continuously to generate continuous wave (CW) plasmas, or may be pulsed to generate pulsed plasmas within the process chamber 205. Pulsed plasmas can be generated by modulating the source power and/or the bias power in time, amplitude and/or phase.

In one example implementation, the RF source 230 may provide about 0 to 1400 W of source power in a high-frequency range from about 3 MHz to 150 MHz (or above) to the upper electrode 220, and the DC pulse generator source 240 may provide negative voltage pulses between 10 nsec and 5 usec at duties from 0.1% to 50% to the lower electrode 225. Different operational ranges can also be used depending on the type of plasma processing system and the type of treatments (e.g., etching, deposition, sputtering, etc.) performed therein.

Figure 3:
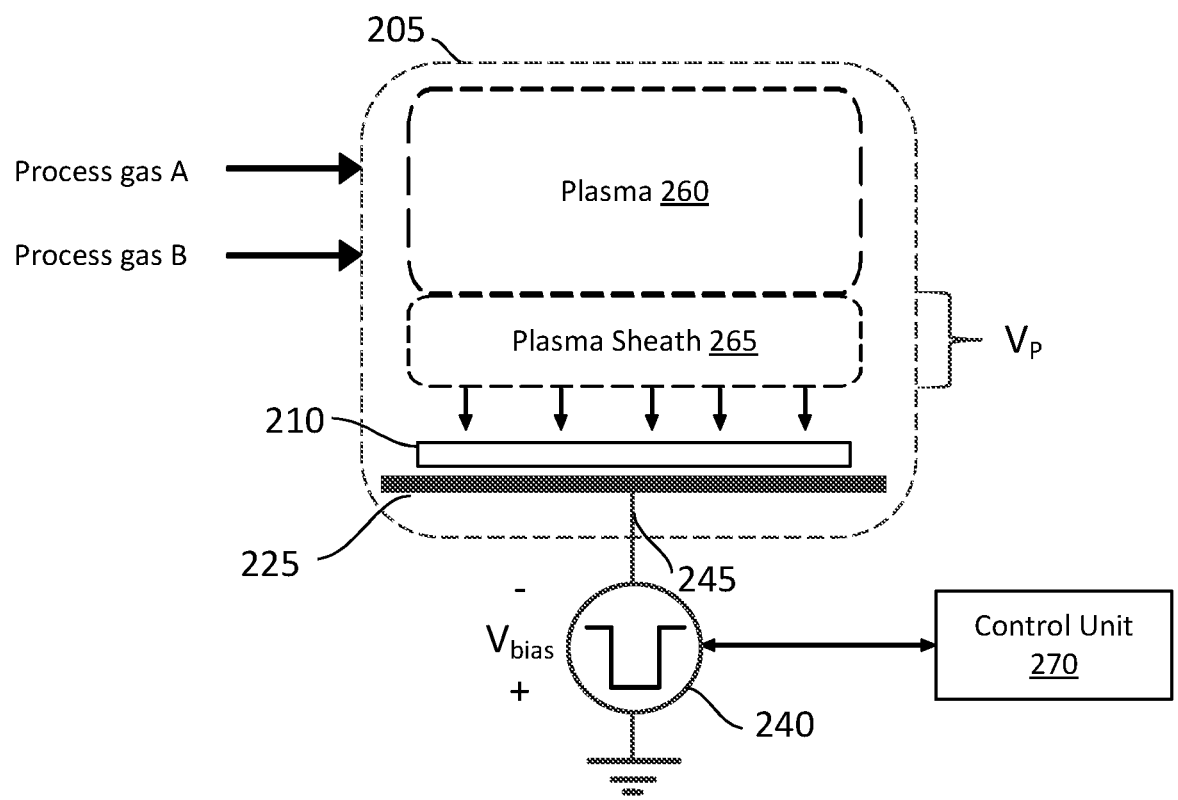
FIG. 3 is a block diagram illustrating a subset of the system components shown in FIG. 2 that may be used to generate a plasma and control ion bombardment energy in a boundary region of the plasma (referred to as the plasma sheath) in accordance with the techniques described herein.

FIG. 3 illustrates one manner for generating a plasma 260 in accordance with the techniques described herein. As shown in FIG. 3, plasma 260 may be generated by supplying one or more process gases (e.g., process gas A and/or process gas B) to the process chamber 205 while power is applied to one or more of the electrodes disposed therein. In the example shown in FIG. 3, a bias voltage 245 from the DC pulse generator source 240 is applied to the lower electrode 225 while process gases A and B are supplied to the process chamber 205. Although not illustrated in FIG. 3, one skilled in the art would understand how, with reference to the FIG. 2 elements, a source voltage 235 from the RF source 230 may also be applied to the upper electrode 220 to generate a high-frequency electric field between the upper electrode 220 and the lower electrode 225. As noted above, the high-frequency electric field dissociates and converts the process gases supplied to the process chamber into a plasma 260.

As known in the art, a plasma 260 is an ionized gas phase substance that consists of (positive and negative) ions, electrons and neutral atoms/molecules that grossly maintain charge neutrality. One important property of plasmas, known as quasi-neutrality, is that the density of the negative species (electrons and negative ions) in the plasma is equal to the density of the positive species (positive ions) in the plasma. Although a majority of the plasma 260 maintains charge neutrality, voltage potentials ($V_P$) can develop across boundary regions of the plasma 260, resulting in a positively charged ion matrix sheath or plasma sheath.

A plasma sheath 265 is a boundary region of the plasma 260 that has only positive ions and neutral species, and thus, an overall positive charge. The plasma sheath 265 ensures that the plasma 260 remains quasi-neutral by confining low energy electrons (and negative ions) within the plasma and accelerating positive ions towards the process chamber walls. Since the flux of bombarding ions is anisotropic (parallel to the electric field), and since the energy of the ions can be tuned (by controlling the sheath voltage, $V_P$), the plasma sheath 265 can be utilized for etching applications, such as plasma atomic layer etching (ALE) processes.

Figure 1:
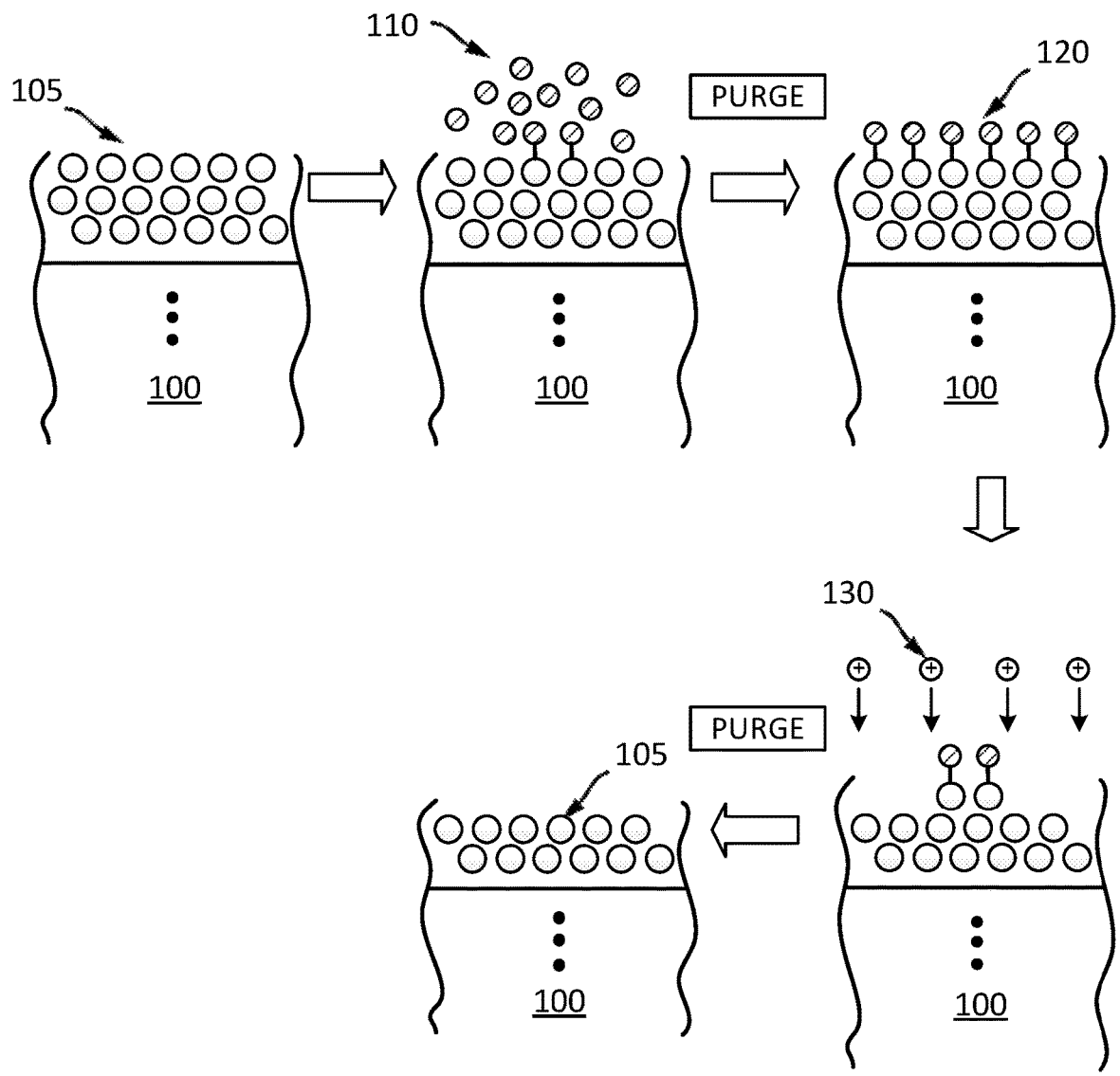
FIG. 1 illustrates a conventional plasma atomic layer etching (ALE) process flow.

As noted above, conventional plasma ALE processes often use a cyclic pulsing of process gases within one or more ALE cycles, where each ALE cycle consists of at least one layer modification step and etch step. In one embodiment, cyclic pulsing of reactive precursors and inert gases is utilized. In such an embodiment, in each layer modification step, a target substrate disposed within a process chamber is exposed to a reactive precursor, which adsorbs on and reacts with the exposed surfaces of the target substrate to modify the surface. In each etch step, exposed surfaces of the target substrate are bombarded with low energy non-reactive ions (e.g., from an inert gas) to remove the modified surface layer. In the conventional plasma ALE process shown for example in FIG. 1, the process chamber is purged after each layer modification step and after each etch step to avoid mixing reactive precursors and inert gases within the process chamber. Because purging consumes seconds per etch cycle, conventional plasma ALE processes generally suffer from low etch rates, low throughput and poor cost-efficiency.

Embodiments of improved plasma ALE processes and methods are provided herein with improved etch rates, throughput and cost-efficiency. Instead of purging the process chamber between layer modification and etch steps, as required in conventional plasma ALE processes, the embodiments described herein supply the reactive precursor (s) and the inert gas(es) needed to perform a given ALE cycle to the process chamber 205, and use selective energy modulation of targeted ion masses to segregate the non-reactive ions from the reactive ions in the plasma sheath 265. By selecting appropriate timing parameters for the energy modulation, the embodiments described herein achieve the ion bombardment required in each ALE cycle, without physically separating the reactive precursors and inert gases within the process chamber, for example as done in the prior art by using a purge step.

It is generally known in the art that ions with different masses have different mobilities and cross the plasma sheath 265 in different times at a given energy. A variety of combinations of ionic and neutral species with different masses may be utilized. For example, combinations may include: (1) Cl/Cl2 neutrals for surface modification and He ions for desorption, (2) CxFy species for surface modification and He or Ar ions for desorption, or (3) H/H2 ions for directional surface modification and F atoms for modified layer removal. It will be recognized that such combinations are merely exemplary, and the techniques described herein are not limited to these examples.

Because of the difference in ion mass, lighter ions (for example inert ions) cross the plasma sheath 265 faster (due to higher mobility) than heavier ions (for example reactive ions) in the presence of a bias voltage 245. The embodiments disclosed herein utilize this difference in ion mobility to achieve surface modification with reactive neutral species in the absence of a bias voltage 245, and preferable ion bombardment at a higher ion energy with lighter, inert ions in the presence of a bias voltage 245. By modulating the bias voltage 245 as disclosed further herein, the embodiments achieve preferable ion bombardment with lighter, inert ions without the need to physically separate the reactive precursors and inert gases supplied to the process chamber 205 for a given ALE cycle. In doing so, the embodiments described herein provide a "fast" plasma ALE process, which improves etch rate, throughput and cost-efficiency by enabling the same gas chemistry composition (e.g., reactive precursor and inert gas combination) to be kept in the process chamber 205 during a given ALE cycle. Though described for illustrative purposes with relation to an exemplary process using an one reactive precursor (for the modification step) and an inert gas for the removal step, it will be recognized that the other examples described herein (for example two reactive ions, etc.) may utilize the bias modulation techniques When process gases A and B are supplied to the process chamber 205, and a source voltage 235 is applied for example to the upper electrode 220, the process gases A and B are mixed and ionized, producing ions A+ and B+ in the plasma 260. In the absence of a bias voltage 245, the initial plasma sheath 265 is relatively thin. When a pulsed bias voltage 245 is applied for example to the lower electrode 225, the electrons in the plasma 260 are repelled from the electrode, exposing an increasingly larger matrix of ions A+ and B+ in an expanding plasma sheath 265. The exposed ions are drained from the plasma sheath 265 towards the electrode and bombard the target substrate with the energy gained in the plasma sheath.

Due to the difference in ion mass of ions A+ and B+, however, the ions cross the plasma sheath 265 at different velocities. For example, the ion velocity (v) through the plasma sheath 265 (having thickness $S_0$) may be represented as:

$$v_i(x) = \sqrt{\frac{2qV}{m_i}} \left[ 1 - \frac{(S_0 - x)^2}{s_0^2} \right]^{1/2} \quad \text{EQ. 1}$$

where i represents ions A+ or B+, q is particle charge, V is the plasma sheath voltage or potential ($V_P$ in FIG. 3) and $m_i$ is the ion mass of ions A+ or B+. As shown in EQ. 1, ions with lighter mass (e.g., non-reactive ions of inert gases) gain higher velocity through the plasma sheath 265 than ions with greater mass (e.g., reactive ions of reactive precursors), and therefore, cross the plasma sheath in a shorter amount of time (referred to herein as a plasma sheath transit time). By selectively modulating or pulsing the bias voltage 245 as set forth below, the embodiments disclosed herein use selective energy modulation of targeted ion masses to select which ions the target substrate is exposed to during the etch step of a given ALE cycle.

Example modulation schemes are provided in FIGS. 4A, 4B, 4C and 4D for modulating the DC bias voltage ($V_{bias}$) used to control ion bombardment energy in the plasma sheath 265. In some embodiments, the DC bias voltage ($V_{bias}$) 245 shown in FIGS. 4A, 4B, 4C and 4D may be applied for example to the lower electrode 225, while a continuous wave (CW) source voltage 235 is applied to the upper electrode 220 of the example plasma processing system 200 shown in FIGS. 2 and 3. In other embodiments, the source and bias voltages applied to the upper and lower electrodes may be reversed.

As shown in FIGS. 4A, 4B, 4C and 4D, the DC bias voltage ($V_{bias}$) can be pulsed "on" and "off" to control ion bombardment energy in the plasma sheath 265, and thus, to select which ions the target substrate is exposed to during the etch step of the ALE cycle. For example, the DC bias voltage 245 may be turned "off" (e.g., $V_{bias}$=0V) and a CW source voltage 235 may be applied during a first time period t1 ($t_{OFF}$). When a CW source voltage 235 is applied, the process gases A and B supplied to the process chamber 205 are mixed and ionized in the plasma 260. Due to the larger ion mass of process gas A (e.g., a reactive precursor), the target substrate receives continuous flux of reactive neutral species A and ionic species A+ at a very ion energy when a CW source voltage 235 is applied and the bias voltage 245 is turned "off." The reactive neutral species A adsorbs on and reacts with the exposed surfaces of the target substrate to modify the surface of the target substrate during the layer modification step of the ALE cycle.

During a second time period t2, the DC bias voltage 245 is turned "on" (e.g., $V_{bias}$=$-V_p$) for a relatively short pulse time ($t_p$) to attract the lighter, non-reactive ions of process gas B (e.g., an inert gas) to the target substrate. Due to their lighter ion mass, ions B+ cross the plasma sheath 265 faster, gaining higher energy over the travel distance that ions A+, and thus, arrive at the target substrate earlier than ions A+ during the pulse time ($t_p$). This enables low energy, non-reactive ions B+ to preferentially bombard the exposed surfaces of the target substrate to etch (i.e., remove) the modified surface layer.

Figure 4A:
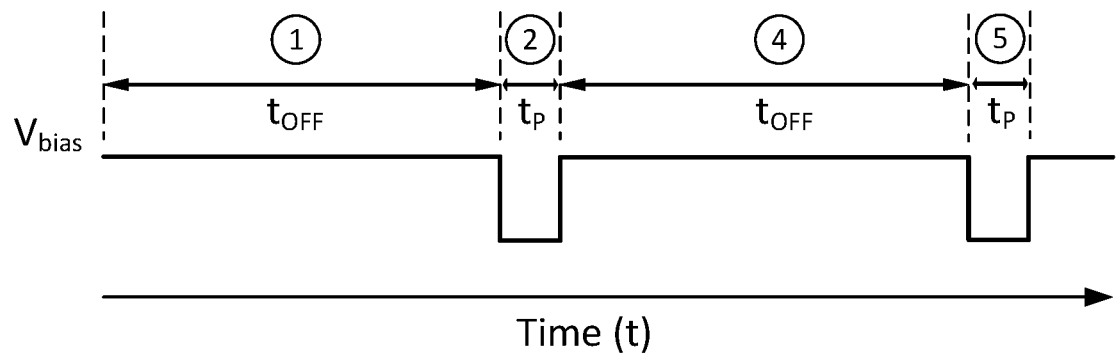
FIG. 4A illustrates one example modulation scheme that may be used herein to modulate a bias voltage used to control ion bombardment energy in the plasma sheath.

In some embodiments, the DC bias voltage 245 may be continuously pulsed "on" and "off" at constant voltage levels (e.g., 0V and $-V_p$) as shown in FIG. 4A and described above. During the pulse "on" times ($t_p$), the DC bias voltage 245 is applied and the target substrate is bombarded with positively charged ions of lighter mass to perform the etch step in an ALE cycle. During the pulse "off" times ($t_{OFF}$), the DC bias voltage 245 is turned "off" to perform the layer modification step in the next ALE cycle and enable the plasma sheath 265 to recover. It will be recognized, however, that FIG. 4A provides only one example of a bias voltage modulation scheme that may be used to control ion bombardment energy during the etch step of a given ALE cycle. In another example embodiment, instead of turning the DC bias voltage 245 "off", a small DC bias voltage 245 (e.g., smaller than $V_p$) may be applied during the layer modification step.

Figure 4B:
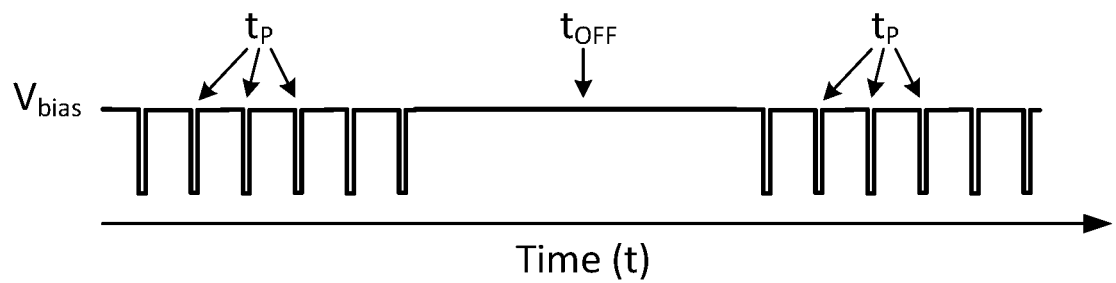
FIG. 4B illustrates another example modulation scheme that may be used herein to modulate a bias voltage used to control ion bombardment energy in the plasma sheath.

In another example embodiment, instead of continuously pulsing the DC bias voltage 245 as shown in FIG. 4A, a modulated pulsing scheme may be used as shown in FIG. 4B. For example, it may not be possible to remove the modified surface layer over the span of one short pulse ($t_p$).

Instead, a series of pulses ($t_P$) may be used to remove the modified surface layer, as shown for example in FIG. 4B. In FIG. 4B, the DC bias voltage 245 is pulsed "on" and "off" to generate a series of short pules ($t_P$) that are used to remove the modified surface layer, turned "off" for a period of time ($t_{OFF}$) that allows surface restoration/chemistry adsorption, and then pulsed "on" and "off" again to generate another series of short pules ($t_P$) that are used to remove the next modified surface layer. By applying a series of pulses ($t_P$) before turning the DC bias voltage 245 "off" ($t_{OFF}$, the plasma sheath relaxation time), it is possible to remove the modified surface layer by ions B+.

Figure 4C:
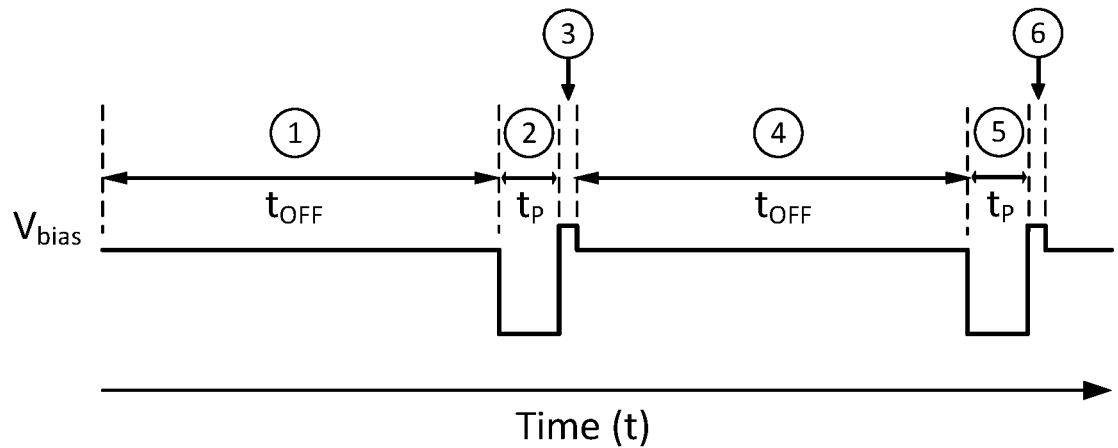
FIG. 4C illustrates yet another example modulation scheme that may be used herein to modulate a bias voltage used to control ion bombardment energy in the plasma sheath.
Figure 4D:
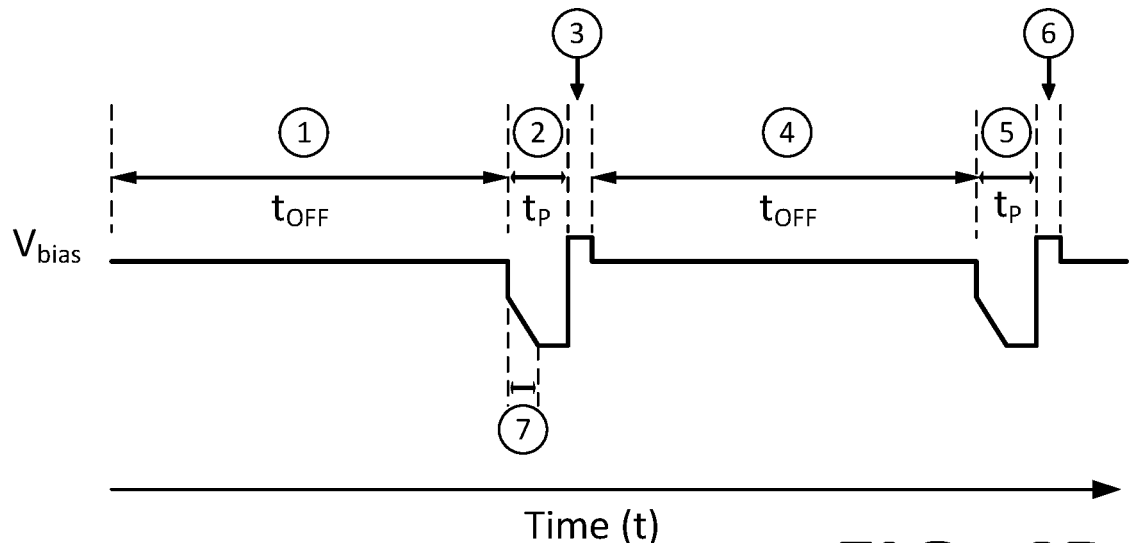
FIG. 4D illustrates a further example modulation scheme that may be used herein to modulate a bias voltage used to control ion bombardment energy in the plasma sheath.

In yet another example embodiment, the polarity of the DC bias voltage 245 may be reversed during a third time period t3, as shown in FIGS. 4C and 4D, to minimize or eliminate target bombardment by the heavier ions A+ before a new ALE cycle is performed (during time periods t4, t5 and t6). In a further example embodiment, the DC bias voltage 245 may be gradually adjusted during a portion of the pulse time ($t_P$) to minimize the impact of ion bombardment on a target substrate when an upper surface of the target substrate comprises a non-conductive (e.g., dielectric) material. In one example implementation, the DC bias voltage 245 may be ramped during a portion (e.g., a seventh time period t7) of the pulse time ($t_P$), as shown in FIG. 4D, to perform the gradual adjusting. Such ramping may advantageously keep the same surface potential on the surface of the target substrate when the target substrate has a non-conductive (e.g., dielectric) layer surface.

The duration of time during which the DC bias voltage 245 is turned "on" and "off" in FIGS. 4A-4D depends on the particular process gases A and B supplied to the process chamber 205 and the expected plasma sheath transit times of the ions A+ and B+. In some embodiments, the DC bias voltage 245 may be turned "on" for a duration of time, $t_P < \omega_{pi}^{-1}$, and may be turned "off" for a duration of time, $t_{OFF} >> \omega_{pi}^{-1}$, where $\omega_{pi}$ is the ion plasma frequency of the lighter ions (e.g., ions A+) in the plasma sheath 265.

The ion plasma frequency ($\omega_{pi}$) (shown in EQ. 2) is proportional to the ion velocity (v) shown in EQ. 1 (reproduced again below), and inversely proportional to the ion matrix sheath thickness ($S_0$) shown in EQ. 3:

$$v_i(x) = \sqrt{\frac{2qV}{m_i}} \left[1 - \frac{(S_0 - x)^2}{S_0^2}\right]^{1/2} \quad \text{EQ. 1}$$

$$\omega_{pi} = \frac{v(x)}{S_0} = \sqrt{\frac{q^2 n_i}{\epsilon_0 m_i}} \quad \text{EQ. 2}$$

$$S_0 = \sqrt{\frac{2\epsilon_0 V}{q n_i}} \quad \text{EQ. 3}$$

In EQS. 2 and 3, $\epsilon_0$ is the free-space permittivity, V is the plasma sheath voltage or potential ($V_P$ in FIG. 3), q is the particle charge, $m_i$ is the ion mass of ions A+ or B+, and $n_i$ is the ion density in the bulk plasma. As noted above, ions of lighter mass ($m_i$) have higher mobilities than heavier ions. Over the short pulse time ($t_P$), lighter ions gain higher velocity (v), travel further distance (x) through the plasma sheath 265, and thus, gain more ion bombardment energy (E), as shown in EQ. 4:

$$E(x) = \frac{m_i v^2}{2} = eV_p \left[1 - \frac{(S_0 - x)^2}{S_0^2}\right]^{1/2} \quad \text{EQ. 4}$$

Thus, in some embodiments, the DC bias voltage 245 may be turned "on" for a short pulse time ($t_P$), which is greater than the transit time of the non-reactive ions (e.g., ions B+) and less than the transit time of the reactive ions (e.g., ions A+) through the plasma sheath 265. In doing so, the embodiments disclosed herein ensure that the lighter, non-reactive ions (e.g., ions B+) will preferentially reach and bombard the exposed surfaces of the target substrate during the etch step of the ALE cycle. Turning the DC bias voltage 245 "off" for a relatively long period of time ($t_{OFF} >> \omega_{pi}^{-1}$) enables the plasma sheath 265 to recover after each pulse.

In one example implementation, helium (He) and chlorine ($Cl_2$) gases may be supplied to the process chamber 205, the DC bias voltage 245 may be turned "off" ($t_{OFF}$), and a CW source voltage 235 may be applied during the first time period t1 to generate a He/$Cl_2$ plasma 260. When the DC bias voltage 245 is turned "off" during the first time period t1, the target substrate receives a continuous flux of reactive neutral species A (e.g., chlorine), which adsorb on and react with the exposed surfaces of the target substrate to modify the surface of the target substrate. When a 50V DC bias voltage 245 is turned "on" in a He/$Cl_2$ plasma 260, transit times for the individual He+, Cl+ and $Cl_2$+ ions through the plasma sheath 265 may be expected to be: He+<100 ns (e.g., 74 ns), Cl+ and $Cl_2$+>200 ns (e.g., 219 ns). By applying a relatively short (e.g., $t_P$<200 ns) DC bias voltage 245 pulse, the embodiments disclosed herein ensure that the target substrate will be preferably bombarded with the lighter, faster He+ ions, which attack the modified surface layer. While the maximum ion bombardment energy of the lighter ions can be 50 eV, the heavier ions may only gain a maximum ion bombardment energy of about 13 eV in this particular case. To minimize target bombardment by the heavier Cl+ and $Cl_2$+ ions, the polarity of the bias voltage 245 may be reversed, in some embodiments, during the third time period t3 of FIGS. 4C and 4D.

In some embodiments, the DC bias voltage 245 may be controlled by a DC pulse generator 240, as shown in FIGS. 2 and 3. In some embodiments, the DC pulse generator may be coupled to a control unit, such as the control unit 270 shown in FIGS. 2 and 3. The DC pulse generator 240 may be programmed or designed with various operational parameters (e.g., $t_P$, $t_{OFF}$, bias voltage amplitude, etc.) to control or modulate the DC bias voltage 245 in accordance with the techniques described herein. Although example modulation schemes for controlling the DC bias voltage 245 are provided in FIGS. 4A-4D, one skilled in the art would understand how other modulation schemes could also be used to achieve the results obtained herein.

The techniques described herein use selective energy modulation to separate ions with different ion masses in the plasma sheath 265 and achieve targeted ion bombardment of selected ion groups (e.g., non-reactive ions from inert gases) within a single plasma volume containing both reactive neutral species and non-reactive ions. By modulating the DC bias voltage 245 as set forth above, the techniques described herein segregate the reactive neutral species from the non-reactive ions in the plasma sheath 265 in different steps of the plasma ALE process cycle. By segregating the ionic/neutral species in the plasma sheath 265, the techniques described herein allow reactive neutral species to modify the surface of the target substrate during the surface modification step of the plasma ALE cycle, and non-reactive ions to remove the modified surface during the etch step of the plasma ALE cycle. The techniques described herein, therefore, provide a "fast" plasma ALE process by enabling the same gas chemistry composition to be kept in the process chamber during a given ALE cycle.

FIGS. 5 and 6 illustrate embodiments of an exemplary method that utilizes the techniques described herein. It will be recognized that the embodiments shown in FIGS. 5 and 6 are merely exemplary and additional methods may utilize the techniques described herein. Further, additional processing steps may be added to the method shown in FIGS. 5 and 6 as the steps described are not intended to be exclusive. Moreover, the order of the steps is not limited to the order shown in the figure as different orders may occur and/or various steps may be performed in combination or at the same time.

FIG. 5 illustrates one embodiment of a method 300 that may be used to perform at least one plasma atomic layer etch (ALE) cycle in accordance with the techniques described herein, where the at least one plasma ALE cycle includes a layer modification step and an etch step. In step 310, the method 300 supplies a first process gas and a second process gas to a process chamber in which a substrate is disposed. In one exemplary embodiment, the first process gas may include a reactive precursor and the second process gas may include an inert gas.

In step 320, the method 300 performs the layer modification step by applying a source voltage to a first electrode disposed within the process chamber to generate an electric field, which dissociates and converts the first process gas and the second process gas into a plasma. A plasma sheath located within a boundary region of the plasma may generally include a mixture of reactive neutral species, first ions from the first process gas having a heavier ion mass and second ions from the second process gas having a lighter ion mass.

In step 330, the method 300 performs the etch step by modulating a bias voltage applied to a second electrode disposed within the process chamber so that only the second ions having the lighter ion mass reach and bombard the substrate during the etch step of the at least one plasma ALE cycle.

FIG. 6 illustrates one embodiment of a method 400 that may be used to perform an atomic layer etch (ALE) in a plasma processing system, where the ALE includes a layer modification step and an etch step. In step 410, the method 400 supplies a first process gas and a second process gas to a process chamber in which a substrate is disposed. In step 420, the method 400 forms a plasma in the process chamber utilizing a source voltage of the plasma processing system.

During the layer modification step (in step 430), the method 400 modifies a surface of the substrate to form a modified surface layer by exposing the surface of the substrate to a first ion species of the plasma. The first ion species may have a first ion mass and may be reactive with the surface of the substrate. During the etch step (in step 440), the method 400 removes the modified surface of the substrate by bombarding the modified surface with a second ion species of the plasma. The second ion species may have a second ion mass, which is lighter than the first ion mass.

In step 450, the method 400 modulates a bias voltage of the plasma processing system so that while removing the modified surface of the substrate (in step 440), the second ion species bombards the modified surface more than the first ion species bombards the modified surface. In step 460, the method 400 cyclically repeats the layer modification step (step 430) and the etch step (step 440).

It is noted that the techniques described herein may be utilized within a wide range of plasma processing systems. Although a particular plasma processing system 200 is shown in FIG. 2, it will be recognized that the techniques described herein may be utilized within other plasma processing systems. In one example system, the sources shown in FIG. 2 may be switched (e.g., source voltages may be supplied to the lower electrode 225 and bias voltages may be supplied to the upper electrode 220). Further, a dual source system is shown in FIG. 2 merely as an example system. It will be recognized that the techniques described herein may be utilized with other plasma processing systems in which a modulated RF power source is provided to one or more electrodes, direct current (DC) bias sources are utilized, or other system components are utilized.

It will be recognized by those skilled in the art that other operating variables for process steps can also be adjusted to further control the various etch processes described herein. The operating variables may include, for example, the chamber temperature, chamber pressure, flowrates of gases, types of gases, and/or other operating variables for the processing steps. Variations can also be implemented while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a substrate are described in various embodiments. The substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method for performing at least one plasma atomic layer etch (ALE) cycle comprising a layer modification step and an etch step, the method comprising:
   supplying a first process gas and a second process gas to a process chamber in which a substrate is disposed, wherein the first process gas is utilized for the layer modification step and the second process gas is utilized for the etch step;
   performing the layer modification step by applying a source voltage to a first electrode disposed within the process chamber to generate an electric field that dissociates and converts the first process gas and the second process gas into a plasma, wherein a plasma sheath located within a boundary region of the plasma comprises a mixture of reactive neutral species, first ions from the first process gas having a heavier ion mass and second ions from the second process gas having a lighter ion mass; and
   performing the etch step by modulating a bias voltage applied to a second electrode disposed within the process chamber so that only the second ions having the lighter ion mass reach and bombard the substrate during the etch step of the at least one plasma ALE cycle.

2. The method of claim 1, wherein the first process gas comprises a reactive precursor and the second process gas comprises an inert gas, the first ions being reactive ions and the second ions being non-reactive ions.

3. The method of claim 1, wherein the first process gas comprises a first reactive precursor and the second process gas comprises a second reactive precursor, the first ions being first reactive ions and the second ions being second reactive ions.

4. The method of claim 1, wherein a purge is not performed between the layer modification step and the etch step.

5. The method of claim 1, wherein modulating the bias voltage comprises turning the bias voltage off during a first time period, while the source voltage is applied, so that the substrate receives continuous flux of the reactive neutral species during the layer modification step of the at least one plasma ALE cycle.

6. The method of claim 5, wherein modulating the bias voltage further comprises turning the bias voltage on for a second time period following the first time period, so that only the second ions reach and bombard the substrate during the etch step of the at least one plasma ALE cycle.

7. The method of claim 6, wherein the second time period is less than a transit time of the first ions through the plasma sheath, and wherein the first time period is greater than the transit time of the first ions through the plasma sheath.

8. The method of claim 6, wherein the second time period is less than a transit time of the first ions through the plasma sheath and greater than a transit time of second ions through the plasma sheath.

9. The method of claim 6, wherein modulating the bias voltage further comprises reversing a polarity of the bias voltage during a third time period, the third time period following the second time period, to minimize the first ions that reach and bombard of the substrate.

10. The method of claim 6, wherein turning the bias voltage on for the second time period comprises applying a direct current (DC) bias voltage to the second electrode during the second time period.

11. The method of claim 10, wherein turning the bias voltage on for the second time period further comprises gradually adjusting the DC bias voltage during a portion of the second time period.

12. A method for performing an atomic layer etch (ALE) in a plasma processing system, the ALE comprising a layer modification step and an etch step, the method comprising:
   supplying a first process gas and a second process gas to a process chamber in which a substrate is disposed;
   forming a plasma in the process chamber utilizing a source voltage of the plasma processing system;
   during the layer modification step, modifying a surface of the substrate to form a modified surface layer by exposing the surface of the substrate to a first ion species of the plasma, the first ion species being reactive with the surface of the substrate;
   during the etch step, removing the modified surface of the substrate by bombarding the modified surface with a second ion species of the plasma, the first ion species having a first ion mass and the second ion species having a second ion mass, which is less than the first ion mass;
   modulating a bias voltage of the plasma processing system so that while removing the modified surface of the substrate, the second ion species bombards the modified surface more than the first ion species bombards the modified surface; and
   cyclically repeating the layer modification step and the etch step.

13. The method of claim 12, wherein a purge is not performed between the layer modification step and the etch step.

14. The method of claim 12, wherein modulating the bias voltage comprises turning the bias voltage on during the etch step and (1) turning the bias voltage off during the layer modification step and/or (2XZ) adjusting the bias voltage to have a smaller amplitude during the layer modification step.

15. The method of claim 14, wherein only the second ion species reach and bombard the substrate during the etch step.

16. The method of claim 14, wherein turning the bias voltage on comprises applying a constant direct current (DC) bias voltage.

17. The method of claim 14, wherein turning the bias voltage on comprises gradually adjusting a DC bias voltage for at least a portion of time.

18. The method of claim 14, wherein a time period in which the bias voltage is turned on is less than a first transit time of the first ion species through a plasma sheath.

19. The method of claim 18, wherein the time period in which the bias voltage is turned on is greater than a second transit time of the second ion species through the plasma sheath.

20. The method of claim 18, wherein a purge is not performed between the layer modification step and the etch step.

* * * * *